(12) United States Patent
Noble

(10) Patent No.: US 6,204,145 B1
(45) Date of Patent: *Mar. 20, 2001

(54) SILICON-ON-INSULATOR ISLANDS AND METHOD FOR THEIR FORMATION

(75) Inventor: Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/130,989

(22) Filed: Aug. 7, 1998

Related U.S. Application Data

(63) Continuation of application No. 08/745,708, filed on Nov. 12, 1996.

(51) Int. Cl.⁷ .................................................. H01L 21/76
(52) U.S. Cl. ........................... 438/412; 438/52; 438/404; 438/405; 257/254
(58) Field of Search ................. 148/DIG. 50, DIG. 159, 148/DIG. 155, DIG. 55; 438/404, 56, 412, 52, 405, 410, 420; 257/254

(56) References Cited

U.S. PATENT DOCUMENTS

| | | | |
|---|---|---|---|
| 4,419,150 | * 12/1983 | Soclof | 148/187 |
| 4,437,226 | * 3/1984 | Soclof | 29/557 |
| 4,561,932 | * 12/1985 | Gris et al. | 29/580 |
| 4,580,331 | * 4/1986 | Soclof | 29/580 |
| 4,685,198 | * 8/1987 | Kawakita | 148/DIG. 50 |
| 4,845,048 | * 7/1989 | Tamaki et al. | 438/412 |
| 5,177,028 | 1/1993 | Manning | 437/41 |
| 5,234,535 | 8/1993 | Beyer et al. | 156/630 |
| 5,416,041 | * 5/1995 | Schwalke | 438/404 |
| 5,422,499 | 6/1995 | Manning | 257/67 |

(List continued on next page.)

OTHER PUBLICATIONS

Abe, et al., "Silicon Wafe–Bonding Process Technology for SOI Structures", Conference on Solid State Devices and Materials, Sponsored by The Japan Society of Applied Physics, 853–856, (1990).

Auberton–Herve, A.J., "SOI: Materials to Systems", Digest of the International Electron Device Meeting, San Francisco, 5–10, (Dec. 1996).

Cartagena, et al., "Bonded Etchback Silicon on Sapphire Bipolar Junction Transistors", In: *The Electrochemical Society Interface*, 2(1) 1064–8208, Program and Abstracts, 183rd Meeting of the Electrochemical Society Pennington, NJ, 65–314, (1993).

Harendt, et al., "Silicon on Insulator Material by Wafer Bonding", *Journal of Electronic Materials*, 20(3), 267–77, (Mar. 1991).

Imthurn, et al., "Bonded Silicon–on Sapphire Wafers and Devices", *Journal of Applied Physics*, 72(6), 2526–7, (Sep. 1992).

(List continued on next page.)

*Primary Examiner*—Chandra Chaudhari
*Assistant Examiner*—David S Blum
(74) *Attorney, Agent, or Firm*—Schwegman, Lundberg, Woessner & Kluth, P.A.

(57) ABSTRACT

Silicon-on-insulator (SOI) islands are formed in a silicon substrate. A first set of trenches is formed in the silicon substrate, leaving laterally-isolated rows of silicon between the trenches. The first set of trenches is then filled with silicon oxide. A second set of trenches is then formed in the silicon substrate at a direction orthogonal to the first set of trenches. Silicon nitride is then deposited over the sidewalls of the second set of trenches. An isotropic chemical etch is then used to fully undercut narrow the laterally-isolated rows of silicon between the second set of trenches to form evacuated regions beneath silicon islands. A subsequent oxidation step fills the evacuated regions to form the SOI islands.

7 Claims, 5 Drawing Sheets

U.S. PATENT DOCUMENTS

| | | | |
|---|---|---|---|
| 5,426,070 | * 6/1995 | Shaw et al. | 438/52 |
| 5,441,591 | 8/1995 | Imthurn et al. | 156/153 |
| 5,691,230 | * 11/1997 | Forbes | 148/DIG. 50 |

OTHER PUBLICATIONS

Lasky, J.B., "Wafer Bonding for Silicon–on–Insulator Technologies", *Applied Physics Letters,* 48(1), 78–80, (Jan. 6, 1986).

Lee, et al., "Novel Pattern Transfer Process for Bonded SOI Giga–bit DRAMs", IEEE International SOI Conference, Piscataway, NJ, 114–115, (1996).

Lu, et al., "Bonding Silicon Wafers by Use of Electrostatic Fields Followed by Rapid Thermal Heating", *Materials Letters,* 4(11), 461–464, (Oct. 1986).

Mumola, et al., "Recent Advances in Thinning of Bonded SOI Wafers by Plasma Assisted Chemical Etching", Proceedings of the Third International Symposium on Semiconductor Wafer Bonding: Physics and Applications, Electrochem. Soc., Pennington, NJ, 28–32, (1995).

Nakamura, et al., "Giga–bit DRAM Cells with Low Capacitance and Low Resistance Bit–Lines on Buried MOSFET's and Capacitors by Using Bonded SOI", *Technical Digest—International Electron Devices Meeting (IEEE),* Piscataway, NJ, 889–892, (1995).

* cited by examiner

SILICON-ON-INSULATOR ISLANDS AND METHOD FOR THEIR FORMATION

This application is a continuation of U.S. Ser. No. 08/745,708 filed Nov. 12, 1996.

THE FIELD OF THE INVENTION

The present invention relates generally to methods and apparatus for isolating semiconductor devices with silicon-on-insulator technology, and more particularly, to forming isolated silicon islands.

BACKGROUND OF THE INVENTION

The advantages of silicon-on-insulator (SOI) technology for complementary metal-oxide-semiconductor (CMOS) integrated circuits (ICs) are well documented. Typically, SOI technology reduces undesired p-n junction capacitance between a source/drain and a substrate by approximately twenty-five-percent as compared to other conventional techniques for CMOS ICs. Furthermore, CMOS ICs fabricated with SOI technology have less active current consumption while maintaining device performance equivalent to that of similar devices formed on bulk-silicon substrates. Other advantages of SOI technology include suppression of the short channel effect, suppression of the body-effect, high punch-through immunity, and reduced latch-up and soft errors. As the demand increases for battery-operated equipment, SOI technology is becoming increasingly more popular due SOI device's low power requirements and high speeds.

There are many different techniques for isolating devices in ICs. A technique is selected based on various attributes, such as minimum isolation spacing, surface planarity, process complexity, and density of defects generated during fabrication.

SIMOX (Separation by IMplanted OXygen) technology is one method for forming SOI structures. SIMOX entails implanting a high dose of oxygen ions at a sufficiently deep level within a silicon substrate. A subsequent anneal step forms a buried oxide layer in the substrate. After the anneal step, an additional layer of epitaxial silicon is usually deposited to obtain a sufficiently thick silicon layer on which to form a device. Disadvantages of SIMOX include SIMOX's high expense and yield loss, which undesirably decreases achievable chip density.

Wafer bonding is another technique for forming an isolation layer in a substrate. In wafer bonding, two oxidized silicon wafers are fused together in a high-temperature furnace. However, wafer bonding undesirably increases the substrate thickness. Furthermore, wafer bonding techniques are often plagued by low production yield due to particles/voids, which prevent adequate bonding between the two wafers in such areas.

Forming silicon islands through a series of etch and oxidation steps is another technique used for forming an isolation layer in a substrate. For example, the Sobczak U.S. Pat. No. 4,604,162 uses a series of a pad oxide layer, a silicon nitride layer, and a silicon dioxide layer, which are photolithographically masked and anisotropically etched to define silicon islands capped with a silicon nitride layer. Then, a second anisotropic etch, such as a reactive ion etch (RIE), removes further substrate material between the silicon islands. The depth of the second anisotropic etch is proportional to the width of the silicon islands. A subsequent oxidation step forms silicon dioxide, undercutting the silicon islands and isolating each of them from surrounding regions.

The etch and oxidation technique described in the Sobczak patent has not been used commercially because it is too costly and consumes too much time to oxidize an area having an effective width as great as that of the feature size. Furthermore, another disadvantage of the method described in the Sobczak patent is that the resulting isolated silicon structure is afflicted with excess mechanical stress and crystal damage at the silicon/oxide interface. The mechanical stress and crystal damage is created due to the volume expansion of thermal oxide during its formation. Typically, the volume of oxide formed is approximately twice that of the silicon consumed in forming the oxide. While thermally growing oxide to undercut the silicon structures, until the silicon structure is completely isolated, the remaining silicon filament connecting the silicon island to the bulk substrate is under considerable tensile stress. Such tensile stress can only be accommodated by the generation and propagation of dislocations. Such dislocations will propagate toward the silicon oxide interface, giving rise to such deleterious electrical effects as high junction leakage and low carrier mobility.

Thus, there is a need for an effective isolation technique that minimizes the generation of dislocations during the isolation process. Such dislocations can potentially degrade device performance. Furthermore, an isolation technique is needed, which allows fabrication of highly dense ICs without increasing the dimensions of the IC.

SUMMARY OF THE INVENTION

The present invention provides a method for forming silicon-on-insulator (SOI) islands on a supporting silicon substrate for subsequent semiconductor device formation. The present invention also provides for SOI structures formed with the method of the invention. In general, fully undercut silicon islands are formed in the silicon substrate, supported by lateral silicon oxide bars extending to the silicon substrate. Silicon oxide is then formed between the silicon islands and the silicon substrate.

In one embodiment of the present invention, the islands are formed by directionally-etching a first set of trenches in a silicon substrate through a blanket pad structure to laterally isolate bars of silicon. Silicon oxide is then formed in the first set of trenches. Next, a second set of trenches is directionally-etched through the blanket pad structure in an orthogonal direction to the first set of trenches. Then, silicon nitride is deposited over the trenches, extending down the sidewalls. An isotropic chemical etch is then used to fully undercut and vertically isolate the laterally-isolated bars of silicon in the substrate. The etch-evacuated regions are filled with an isolating oxide to complete the SOI structure. The isolating oxide used to fill the etch-evacuated regions is a combination of thermal oxide and chemical vapor deposition (CVD) oxide.

The resulting SOI structure formed according to the present invention comprises a plurality of silicon islands in a silicon substrate. Chemical vapor deposition silicon oxide extends from the top of the SOI structure to the silicon substrate, vertically isolating the silicon islands. Thermal silicon oxide extends between the silicon islands and the silicon substrate, horizontally isolating the silicon islands.

Resulting SOI structures, formed with the method of the present invention, have a minimum amount of mechanical stress and crystal damage at the silicon/oxide interface because silicon filaments do not connect the silicon islands to the bulk substrate during thermal oxidation. Thus, compressive stress resulting from volume expansion of the growing oxide between the silicon filament and growing oxide is eliminated. As integrated circuits are becoming more dense, it is important to minimize such imperfections in devices to optimize electrical performance. The method of this invention is also compatible with forming SOI structures, without decreasing achievable device density as do the wafer bonding and SIMOX methods.

DESCRIPTION OF THE PREFERRED EMBODIMENTS

In the following detailed description of the preferred embodiments, reference is made to the accompanying drawings which form a part hereof, and in which is illustrated by way of specific embodiments in which the invention may be practiced. It is to be understood that other embodiments may be utilized and that structural or logical changes may be made without departing from the scope of the present invention. For example, the terms wafer and substrate used in the following description include any semiconductor-based structure having an exposed silicon surface in which to form the silicon-on-insulator (SOI) structure of this invention. Wafer and substrate are used interchangeably to refer to semiconductor structures during processing. Both are to be understood as including silicon-on-sapphire (SOS) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims.

Figure 1:
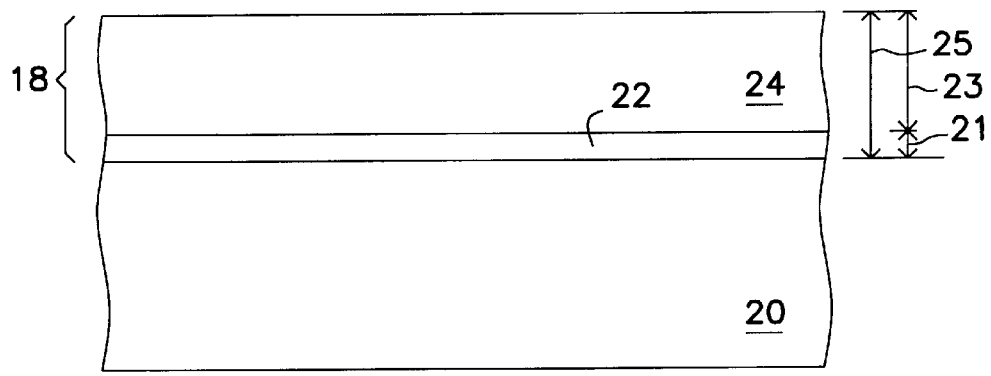
FIG. 1 is a cross-sectional representation of a silicon substrate and pad structure, in which a silicon-on-insulator (SOI) structure is subsequently created.

One method of forming a SOI structure according to the present invention is illustrated in FIGS. 1 to 14. In FIGS. 1 to 14, successive Figures illustrate the SOI structure formed and various intermediate structures formed during its fabrication. As illustrated in FIG. 1, a blanket pad structure 18 is formed on a silicon wafer 20, comprising a relatively thin (approximately 100 to 200 angstroms, as indicated by arrows 21) thermal oxide film 22 covered by a relatively thick (approximately 900 to 2,900 angstroms, as indicated by arrows 23) chemical vapor deposition (CVD) silicon nitride film 24. The total thickness of the blanket pad structure 18 is approximately 1,000 to 3,000 angstroms, as indicated by arrows 25. The total thickness 25 of the blanket pad structure 18 is adjusted to ensure that subsequent planarization steps stop at the edge of the blanket pad structure 18. In other words, the type of planarization step used dictates the required total thickness 25 of the blanket pad structure 18.

Figure 2:
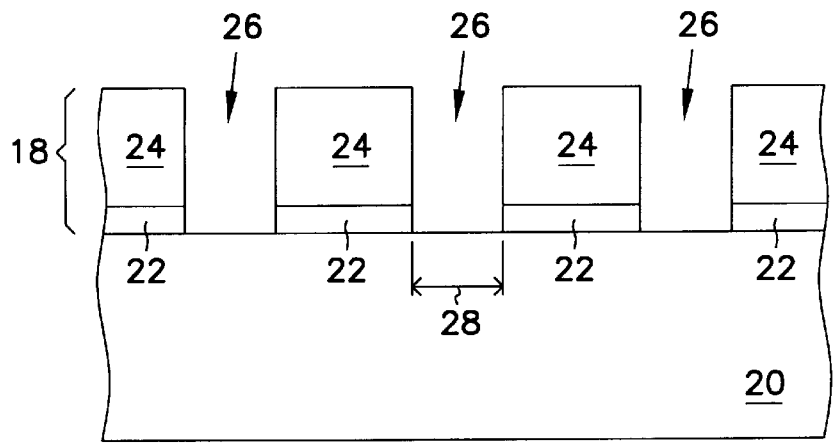
FIG. 2 is a cross-sectional representation of the first set of trenches formed in the pad structure for formation of the SOI structure.

A structure, as illustrated in FIG. 2, is then formed, by defining a first set of trenches 26 in the blanket pad structure 18 with conventional lithography. Conventional lithography comprises applying a resist, masking the resist, directionally etching to expose the silicon wafer 20 in a first set of trenches 26, and removing the resist. The width, as indicated by arrows 28, of the first set of trenches 26 is determined according to the desired dimensions of the silicon islands to be formed. Currently, the desired width of a silicon island is approximately 0.5 microns. However, the present invention is not meant to be limited to applications with dimensions of 0.5 microns. Industry predictors project that 0.35, 0.25, and 0.18 micron technology will soon be available. The present invention is also applicable to forming SOI structures having such smaller dimension technology.

Figure 3:
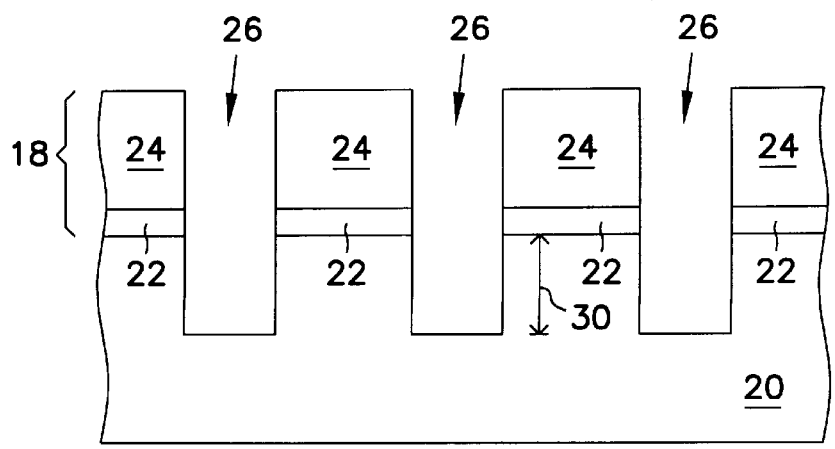
FIG. 3 is a cross-sectional representation of the fully-etched first set of trenches formed in the silicon substrate and pad structure for formation of the SOI structure, taken along the line 3—3 of FIG. 4.
Figure 4:
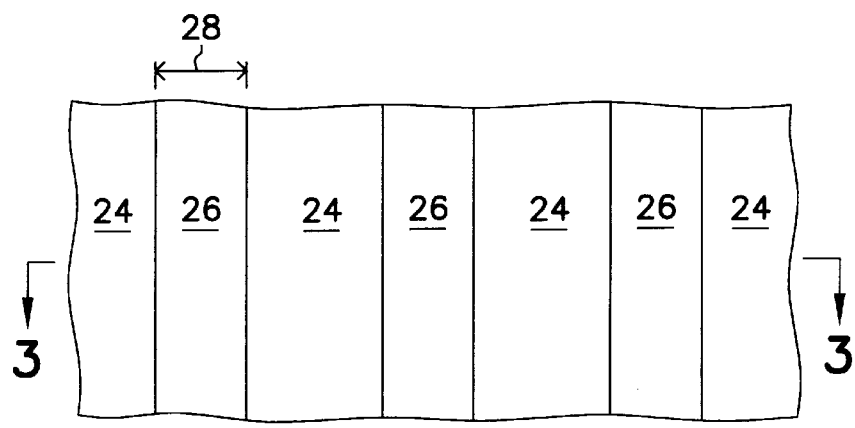
FIG. 4 is a plan view of the structure illustrated in FIG. 3.

A structure, as illustrated in FIGS. 3 and 4, is then formed by further directionally-etching the first set of exposed silicon trenches 26. An anisotropic etchant, such as a reactive ion etch (RIE), is employed to directionally-etch the first set of exposed silicon trenches 26 to the full depth, as indicated by arrows 30, of the final SOI structure. Currently, the full depth 30 of final SOI structures is typically 0.75 microns or greater, and is typically approximately equal to the depth of the silicon island plus one-half the width of the silicon island to be formed.

Figure 5:
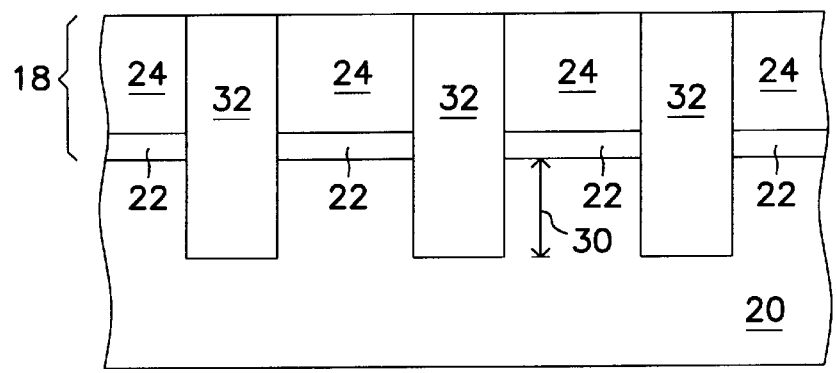
FIG. 5 is a cross-sectional representation of silicon oxide bars formed in the first set of trenches during formation of the SOI structure, taken along the line 5—5 of FIG. 6.
Figure 6:
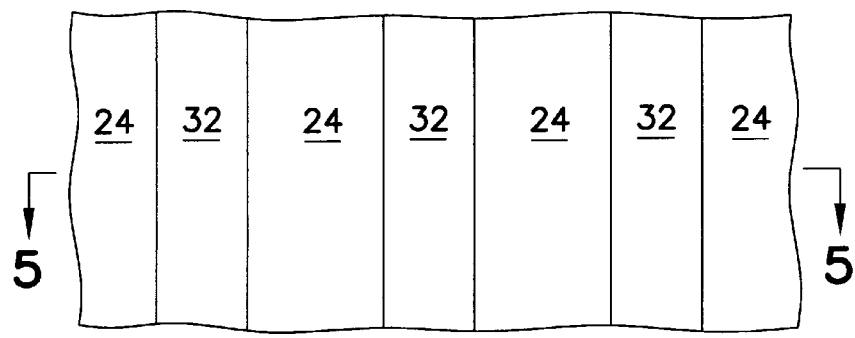
FIG. 6 is a plan view of the structure illustrated in FIG. 5.

A structure, as illustrated in FIGS. 5 and 6, is then formed by filling the first set of trenches 26 with CVD silicon oxide 32 and planarizing the structure. Any suitable type of planarization technique known to one skilled in the art, such as chemical mechanical polishing (CMP), is employed to produce the structure of FIGS. 5 and 6 having laterally-extending silicon oxide bars 32.

Figure 7:
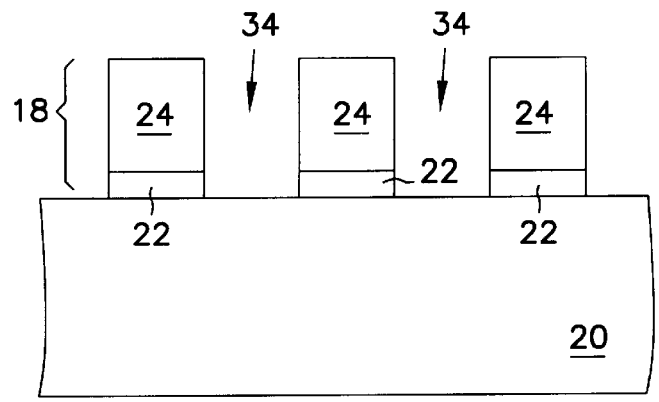
FIG. 7 is a cross-sectional representation of the second set of trenches formed in the pad structure for formation of the SOI structure.

A structure, as illustrated in FIG. 7, is then formed by directionally etching a second set of trenches 34 through the remaining blanket pad structure 18 to expose silicon 20. The direction of the etch is orthogonal to the silicon oxide bars 32. This second set of trenches 34 is defined with conventional lithography in a similar manner to the first set of trenches 26 as described above. As described above, conventional lithography comprises applying a resist, masking the resist, etching to expose the silicon wafer 20, and removing the resist.

Figure 8:
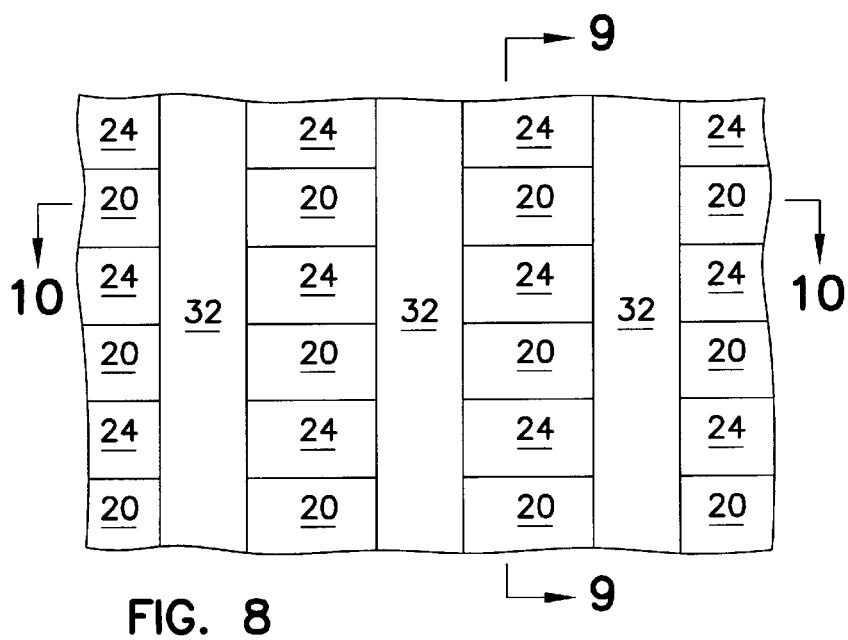
FIG. 8 is a plan view of the structures illustrated in FIGS. 9 and 10.
Figure 9:
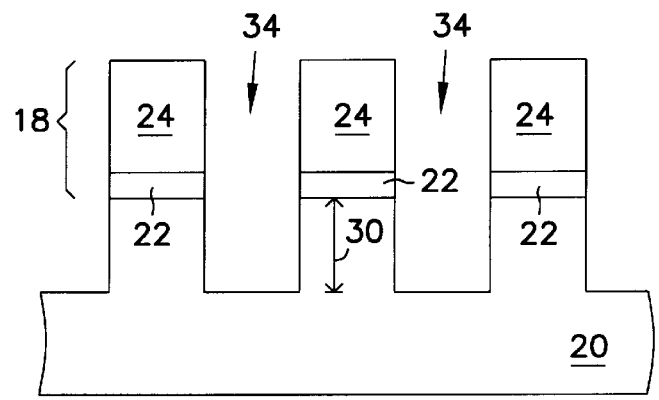
FIG. 9 is cross-sectional representation of the fully-etched second set of trenches, taken along the line 9—9 of FIG. 8.
Figure 10:
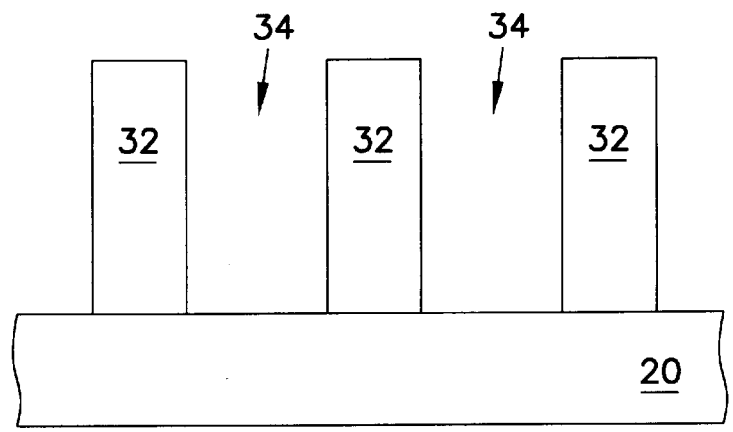
FIG. 10 is a cross-sectional representation of the fully-etched second set of trenches formed in the silicon substrate and pad structure for formation of the SOI structure, taken along the line 10—10 of FIG. 8 orthogonal to the cross-sectional representation illustrated in FIG. 9.

A structure, as illustrated in FIGS. 8 to 10, is then formed by etching the exposed silicon 20 to the full depth, as indicated by arrows 30, of the desired SOI structure. The exposed silicon 20 is etched with a preferential directional etchant, such as RIE. FIG. 10 illustrates a cross-section (10—10) of the structure at this stage in processing, the view of which is taken orthogonal to the cross-sectional view (9—9) illustrated in FIG. 9 in the plane of the second set of trenches 34.

Figure 11:
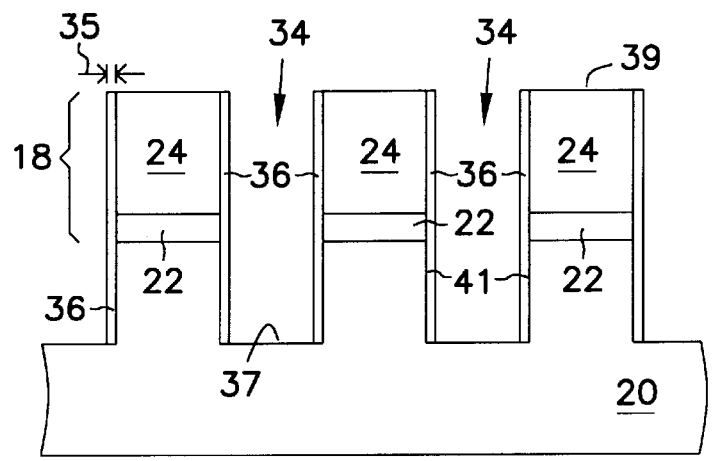
FIG. 11 is a cross-sectional representation of the structure illustrated in FIG. 9, in which silicon nitride is formed on the sidewalls of the structure to act as an oxidation barrier.

A structure, as illustrated in FIG. 11, is then formed by depositing a relatively thin (approximately a few hundred angstroms thick as indicated by arrows 35) layer of CVD silicon nitride 36 is deposited on the structure. The CVD silicon nitride 36 is then directionally-etched with an etchant such as a RIE. During this directional etch step, silicon nitride 36 is removed from the bottoms and tops of the structure of FIG. 11, indicated at 37 and 39 respectively. The resulting structure of FIG. 11 has silicon nitride 36 remaining only on sidewalls of the second set of trenches 34, as indicated at 41. The silicon nitride 36 acts as an oxidation and etch barrier during subsequent steps.

Figure 12:
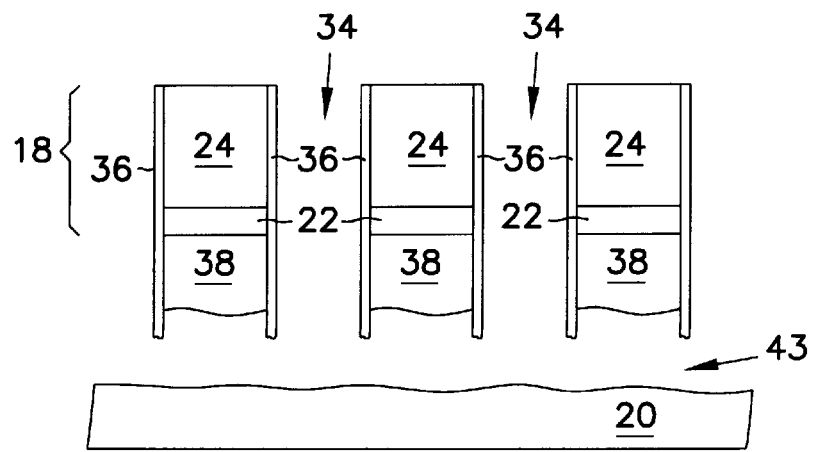
FIG. 12 is a cross-sectional representation of the structure illustrated in FIG. 12, in which an isotropic etchant was used to undercut silicon islands in the structure.

Completely undercut silicon islands 38, as illustrated in FIG. 12, are then formed by etching the silicon substrate 20 with an isotropic etchant. The exposed silicon 20 is etched downward and in a lateral direction until completely undercut silicon islands 38 are formed having etch-evacuated voids 43 defined thereunder. A standard chemical etch, such as a commercial etchant sold under the trade name CP4 (a mixture of approximately 1 part (46% HF): 1 part ($CH_3COOH$):3 parts ($HNO_3$)), is used for the isotropic etchant. An isotropic etch is employed in this step to compensate for the volume of oxide to be formed in the next step. While it appears, from viewing FIG. 12, that the silicon islands 38 are unsupported on the bulk silicon substrate 20, the silicon oxide bars 32 formed in the first set of trenches 26, as illustrated in Figure I10, laterally support the silicon islands 38 because they are still bonded to the silicon substrate 20.

Figure 13:
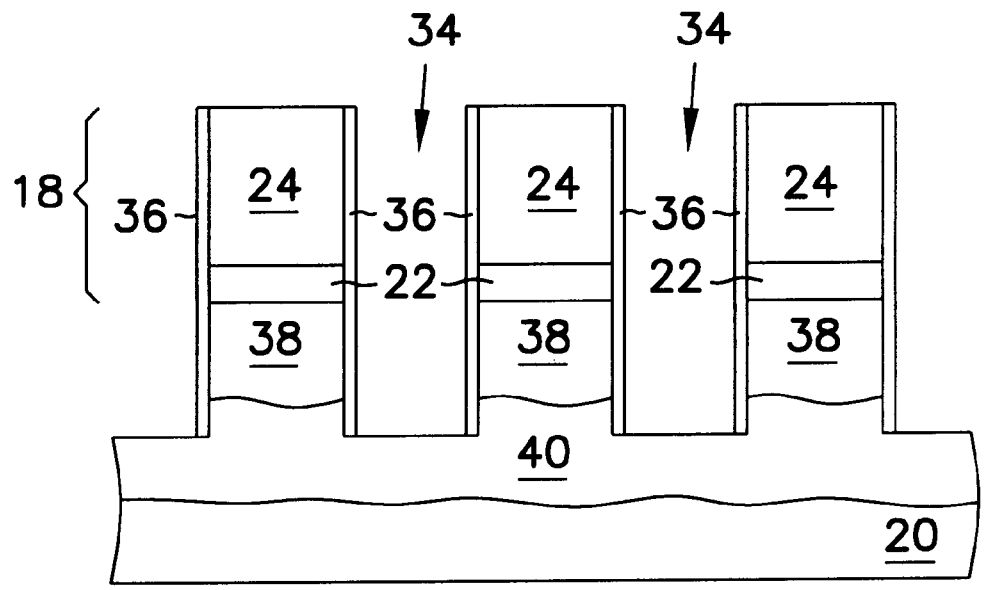
FIG. 13 is a cross-sectional representation of the structure illustrated in FIG. 12, in which thermal oxide fills the etch-evacuated voids illustrated in FIG. 12.

A structure, as illustrated in FIG. 13, is then formed by growing thermal oxide to form an oxide layer 40 beneath the silicon islands 38, further supporting the silicon islands in addition to the support provided by the lateral silicon oxide bars 32 illustrated in FIG. 10. Thermal oxide 40 is formed utilizing a standard silicon processing furnace at a temperature of approximately 900 to 1,100 degrees Celsius. A wet, oxidizing ambient is used in the furnace chamber to oxidize the exposed silicon 20 surrounding the etch-evacuated voids 43, illustrated in FIG. 12, beneath the silicon islands 38. The oxidation time is selected to cause the etch-evacuated voids 43 beneath the silicon islands 38 to be filled. Due to the fact that silicon filaments do not connect the silicon islands 38 to the bulk substrate 20 during thermal oxidation, no tensile stress-induced crystal damage at the silicon/oxide interface occurs. Furthermore, tensile stress resulting from volume expansion of the growing oxide 40 between the silicon filament and growing oxide 40 is also eliminated.

Figure 14:
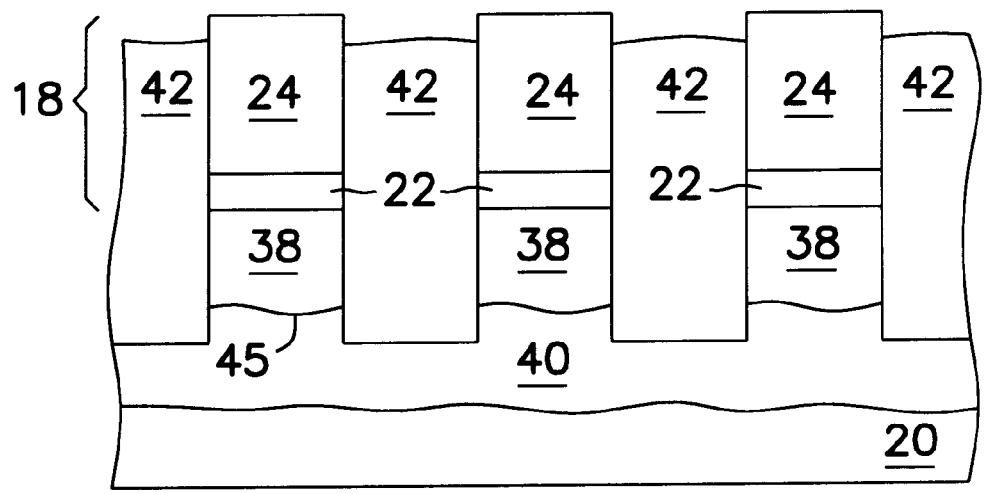
FIG. 14 is a cross-sectional representation of the final SOI structure, in which chemical vapor deposition silicon oxide fills the second set of trenches in the resulting planarized structure.

A structure, as illustrated in FIG. 14, is then formed by removing the thin silicon nitride layer 36 from the trench walls with a nitride etchant, such as phosphoric acid. CVD silicon oxide 42 is then deposited over the structure to fill the second set of trenches 34 alongside the silicon islands 38. The structure of FIG. 14 is then planarized with any suitable type of planarization technique known to one skilled in the art, such as chemical mechanical polishing (CMP), up to the remaining blanket pad structure 18. The remaining blanket pad structure 18 is optionally removed at this point, or alternatively, the remaining blanket pad structure 18 is retained for any subsequent processing purposes.

With the method of this invention, resulting SOI structures have a minimum amount of mechanical stress and crystal damage at the silicon/oxide interface 45, as illustrated in FIG. 14. This is due to the fact that silicon filaments do not connect the silicon islands 38 to the bulk substrate 20 during thermal oxidation. Thus, stress resulting from volume expansion of the growing oxide 40 between the silicon filament and growing oxide 40 is eliminated, as is the resulting crystal damage. As integrated circuits are becoming more dense, it is important to minimize such imperfections in devices to optimize device performance. The method of this invention is also compatible with forming SOI structures, without decreasing achievable device density as with the wafer bonding and SIMOX methods.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of making one or more silicon-on-insulator structures in an integrated circuit, the method comprising:

forming a first set of trenches in the silicon substrate to define laterally-isolated bars of silicon in the silicon substrate;

filling the first set of trenches with silicon oxide to form silicon oxide bars;

forming a second set of trenches in the substrate, wherein the second set of trenches intersect the first set of trenches to form silicon islands at least partly bounded by the silicon oxide bars and the second set of trenches;

fully undercutting the laterally-isolated bars of silicon between the second set of trenches to define substantially evacuated regions underneath the silicon islands, the evacuated regions fully separating the islands from the substrate and leaving the islands supported only by respective portions of the silicon oxide bars; and filling the substantially evacuated regions with silicon oxide after fully undercutting the laterally-isolated bars of silicon, with the silicon oxide preventing free movement of one or more of the silicon islands relative the silicon substrate.

2. The method of claim 1, further comprising forming an oxide film and a silicon nitride film on the silicon substrate before forming the first and second sets of trenches.

3. The method of claim 2, further comprising:

removing the silicon nitride layer; and filling the second set of trenches with silicon oxide.

4. The method of claim 1:

wherein forming the first set of trenches comprises a directional etch; or wherein filling the first set of trenches comprises depositing silicon oxide; or wherein forming the second set of trenches comprises a preferential directional etch; or wherein fully undercutting the laterally isolated bars of silicon comprises isotropic etching; or wherein filling the evacuated regions with silicon oxide comprises growing an oxide in the substantially evacuated regions.

5. A method of making a semiconductor-on-insulator structure in an integrated circuit, the method comprising:

forming one or more insulative structures at least partly submerged in an semiconductive substrate;

forming one or more semiconductive islands integral to the semiconductive substrate, after forming the one or more insulative structures, each island having a lateral surface attached to at least one of the insulative structures;

removing semiconductive material to form one or more vertical gaps between corresponding portions of one or more of the semiconductive islands and the semiconductive substrate, with each vertical gap fully separating at least one of the semiconductive islands from the semiconductive substrate and leaving the one of the semiconductive islands supported only by the attached insulative structures; and forming an insulative structure within one or more of the vertical gaps after removing semiconductive material from the semiconductive substrate, with the insulative structure preventing free movement of one or more of the semiconductive islands relative the semiconductive substrate.

6. The method of claim 5, wherein forming the one or more insulative structures comprises forming a first set of one or more trenches in the semiconductive substrate and at least partly filling one or more of the first set of trenches with an insulative material to form the one or more insulative structures;

wherein forming the one or more semiconductive islands integral to the semiconductive substrate comprises forming a second set of one or more trenches in the semiconductive substrate, with the second set of trenches intersecting the first set of trenches; and wherein removing semiconductive material to form one or more gaps comprises fully undercutting the one or more semiconductive islands.

7. The method of claim 5, wherein the semiconductive islands and the semiconductive substrate consist essentially of silicon and the insulative material consists essentially of a silicon oxide.

* * * * *